(12) United States Patent   (10) Patent No.: US 7,782,514 B2
Moidu                       (45) Date of Patent: Aug. 24, 2010

(54) PIVOTING MICRO-MIRROR MEMS DEVICE WITH A SANDWICHED STRUCTURE AND A CLOSED CELLULAR CORE

(75) Inventor: Abdul Jaleel K. Moidu, Nepean (CA)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 11/778,798

(22) Filed: Jul. 17, 2007

(65) Prior Publication Data

US 2008/0018975 A1    Jan. 24, 2008

Related U.S. Application Data

(60) Provisional application No. 60/807,658, filed on Jul. 18, 2006.

(51) Int. Cl.
    *G02B 26/08* (2006.01)
(52) U.S. Cl. .............. 359/199.4; 359/214.1; 359/224.1
(58) Field of Classification Search ......... 359/196–226, 359/838, 846, 872, 290, 292, 298, 848
    See application file for complete search history.

(56) References Cited

U.S. PATENT DOCUMENTS

| 6,327,855 | B1 | 12/2001 | Hill et al. |
| 6,491,404 | B2 | 12/2002 | Hill |
| 6,535,319 | B2 | 3/2003 | Buzzetta et al. |
| 6,791,730 | B2 * | 9/2004 | Sniegowski et al. ...... 359/223.1 |
| 2002/0126455 | A1 | 9/2002 | Wood |
| 2003/0052569 | A1 | 3/2003 | Dhuler et al. |

\* cited by examiner

*Primary Examiner*—Stephone B Allen
*Assistant Examiner*—Jennifer L. Doak
(74) *Attorney, Agent, or Firm*—Teitelbaum & MacLean; Neil Teitelbaum; Doug MacLean

(57) ABSTRACT

A large micro-mirror, e.g. 3 mm by 4 mm, in accordance with the present invention has sufficient rigidity to ensure a low mirror curvature, e.g. a radius of curvature greater than 5 meters, and a low mass in order to ensure a high oscillation frequency, e.g. greater than 1000 Hz. A method of making the micro-mirror utilizes bulk micro-machining technology, which enables the manufacture of a honeycomb structure sandwiched between two solid and smooth silicon layers without any indentations or holes. The honeycomb sandwich structure provides the rigidity and low mass needed to obtain a micro-mirror with a low mirror curvature and high resonant frequency.

12 Claims, 17 Drawing Sheets

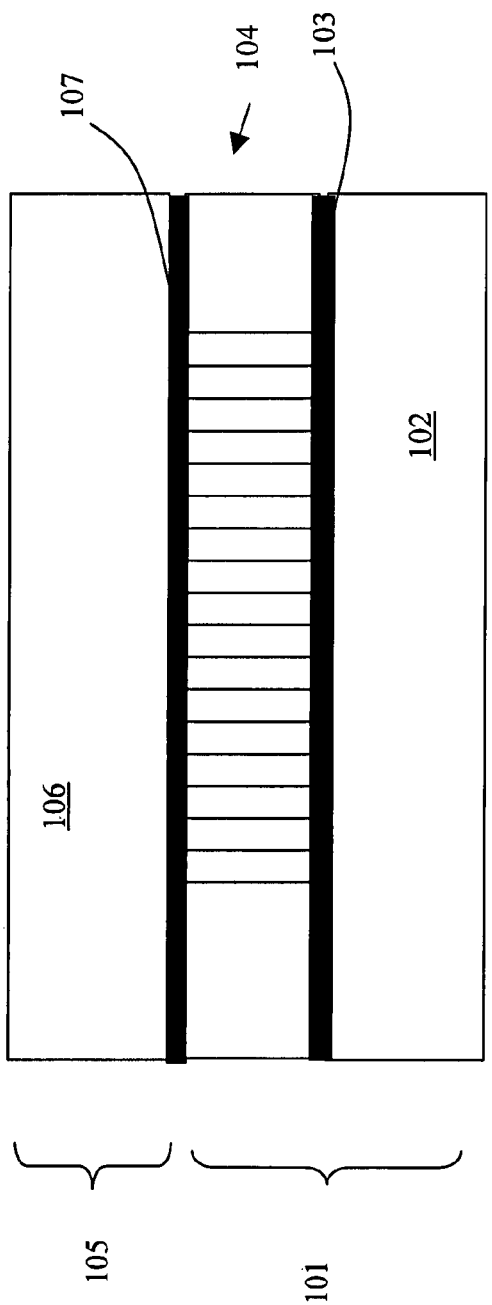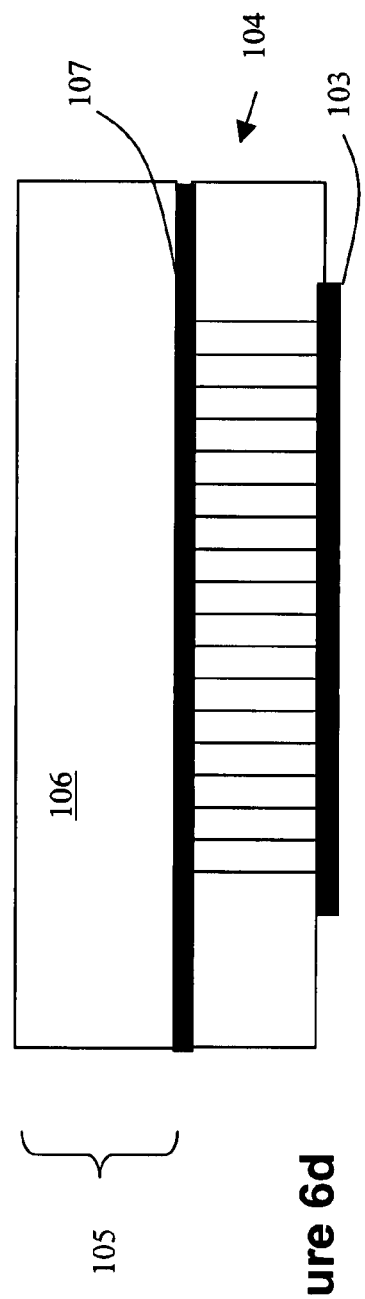

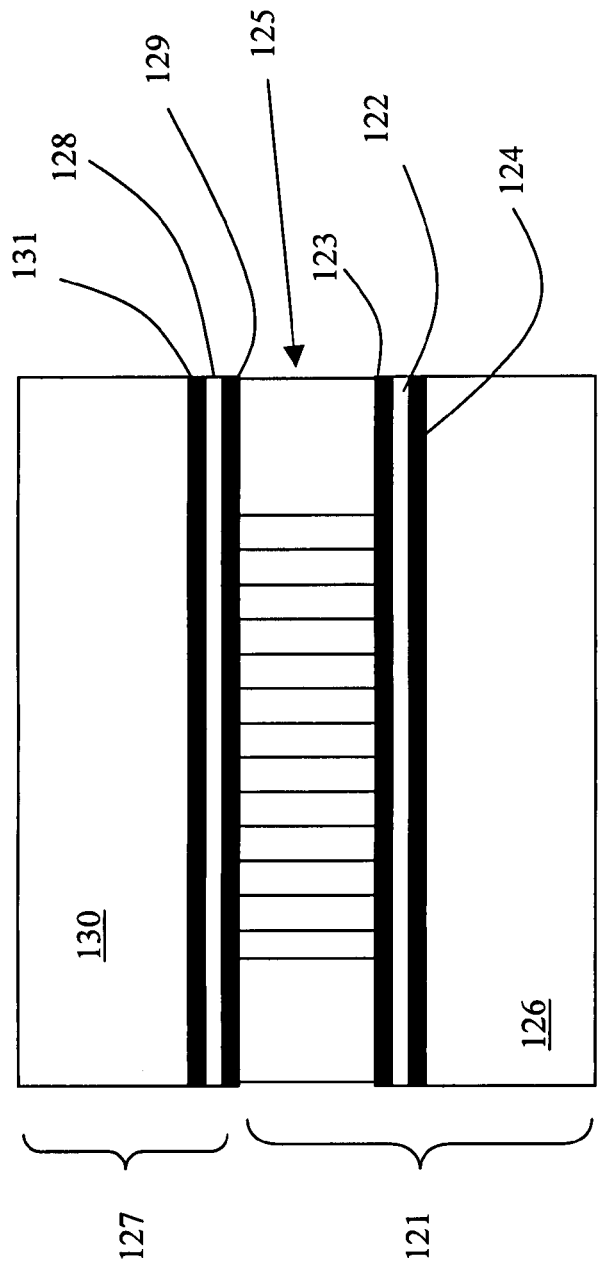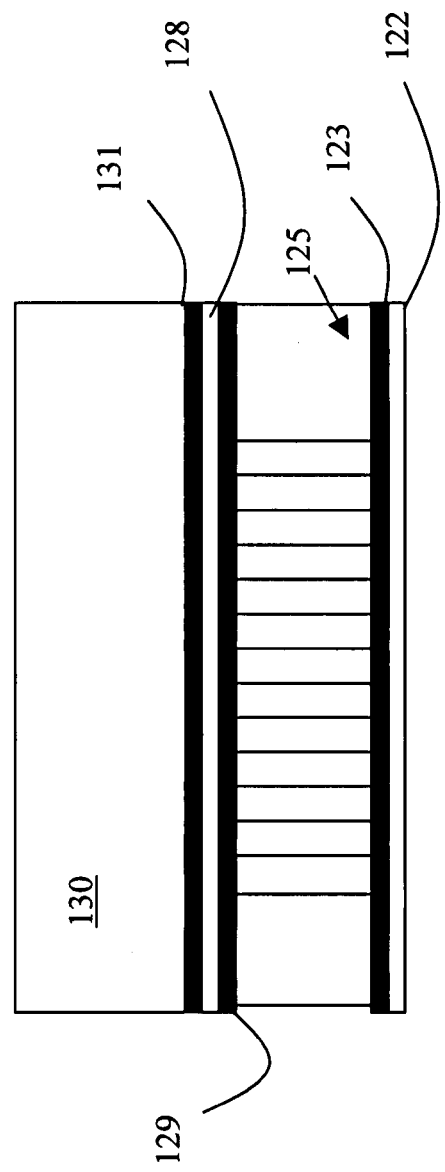
Figure 8c
Figure 8d

PIVOTING MICRO-MIRROR MEMS DEVICE WITH A SANDWICHED STRUCTURE AND A CLOSED CELLULAR CORE

CROSS-REFERENCE TO RELATED APPLICATIONS

The present invention claims priority from U.S. Patent Application No. 60/807,658 filed Jul. 18, 2006, which is incorporated herein by reference.

TECHNICAL FIELD

The present invention relates to a micro-electro-mechanical (MEMS) device, and in particular to a MEMS device including a tilting platform having a sandwiched structure with a closed cellular core.

BACKGROUND OF THE INVENTION

Conventional MEMs mirrors for use in optical switches, such as the one disclosed in U.S. Pat. No. 6,535,319 issued Mar. 18, 2003 to Buzzetta et al, redirect beams of light to one of a plurality of output ports, and include an electro-statically controlled mirror pivotable about a single axis. Tilting MEMs mirrors, such as the ones disclosed in U.S. Pat. No 6,491,404 issued Dec. 10, 2002 in the name of Edward Hill, and United States Patent Publication No. 2003/0052569, published Mar. 20, 2003 in the name of Dhuler et al, which are incorporated herein by reference, comprise a mirror pivotable about a central longitudinal axis. The MEMs mirror device 1, disclosed in the aforementioned Hill patent, is illustrated in FIG. 1, and includes a rectangular planar surface 2 pivotally mounted by torsional hinges 4 and 5 to anchor posts 7 and 8, respectively, above a substrate 9. The torsional hinges may take the form of serpentine hinges, which are disclosed in U.S. Pat. No. 6,327,855 issued Dec. 11, 2001 in the name of Hill et al, and in United States Patent Publication No. 2002/0126455 published Sep. 12, 2002 in the name of Robert Wood, which are incorporated herein by reference.

One of the main challenges facing MEMS designers of larger sized mirrored platforms, e.g. 2 mm to 3 mm in length, is the conflicting requirement of high mirror resonance frequency and low stress-induced mirror curvature. The former demands a relatively thin light mirror, while the latter requires a relatively thick structure. When the mirror is too thin, the reflective surfaces will have excessive curvature induced by the stresses in the reflective coatings or internal stresses in the mirror itself, which results in excessive optical coupling losses. However, making the mirror too thick makes it heavy, thereby lowering the resonant frequency for a given hinge stiffness. Moreover, increasing the hinge stiffness to compensate for a heavy mirror would require too high a voltage to drive the mirror electro-statically to the desired angle.

U.S. Pat. No. 6,791,730 issued Sep. 14, 2004 to Sniegowski et al discloses a micro-mirror structure including stiffening ribs or rails between upper and lower layers. The structure disclosed in the Sniegowski et al reference is realized using surface micro-machining processes, which are generally limited to the manufacture of relatively small mirrors. Many optical switching applications require large area mirrors tilting to a relatively high angle, thereby requiring a large swing space underneath, which is difficult to achieve using surface micro-machining. Moreover, when closed cells are used as the stiffening members, access holes have to be etched on the optically active upper layer to allow for the removal of any sacrificial layers that are disposed therebetween, resulting in a plurality of dimples or the like formed in an upper surface of the upper layer, which have an adverse impact on the optical performance capabilities thereof, thereby making the mirror unacceptable in many applications.

An object of the present invention is to overcome the shortcomings of the prior art by providing a sandwich structure including upper and lower smooth and solid skins, and a closed cellular core to minimize curvature and maximize resonance frequency.

SUMMARY OF THE INVENTION

Accordingly, the present invention relates to a micro-mirror device comprising:

a mirrored platform including a sandwich structure having an upper uniform, smooth and uninterrupted layer; a core layer having a closed cellular structure; and a lower uniform, smooth and uninterrupted layer;

a hinge structure enabling the mirrored platform to rotate about an axis of rotation above a substrate; and attracting means for rotating the mirrored platform about the axis of rotation.

Another aspect of the present invention relates to a method of manufacturing the micro-mirror device, comprising the steps of:

a) providing a first semiconductor on insulator structure including a first semiconductor layer, a first insulator layer, and a second semiconductor layer;

b) etching the second semiconductor layer to form a core layer having closed cellular structures;

c) providing a second semiconductor on insulator structure including a third semiconductor layer and a second insulator layer;

d) bonding the second semiconductor on insulator structure to the first semiconductor on insulator structure forming a sandwich structure having an upper uniform, smooth and uninterrupted skin layer, and a lower uniform, smooth and uninterrupted skin layer, with the core layer therebetween;

e) providing a substrate with an electrode mounted thereon;

f) mounting the sandwich structure on the substrate above the electrode; and g) etching the sandwich structure to form hinges and a rotatable platform.

BRIEF DESCRIPTION OF THE DRAWINGS

The invention will be described in greater detail with reference to the accompanying drawings which represent preferred embodiments thereof, wherein:

FIG. 2b is a partly sectioned isometric view of the large micro-mirror structure of FIG. 2a;

FIG. 3 is a cross-sectional view of the micro-mirror structure of FIG. 2a;

FIG. 4 is an isometric view of a portion of the core layer of the micro-mirror structure of FIG. 2a;

FIG. 5 is an isometric view of a portion of the core layer of the micro-mirror structure of FIG. 2a;

FIGS. 6a to 6g illustrate a process of manufacturing the micro-mirror structure of FIG. 2a;

FIGS. 7a to 7g illustrate an alternative embodiment of the process of FIGS. 6a to 6g for manufacturing the micro-mirror structure of FIG. 2a; and FIGS. 8a to 8g illustrate an alternative embodiment of the process of FIGS. 6a to 6g for manufacturing the micro-mirror structure of FIG. 2a;

DETAILED DESCRIPTION

Figure 1:
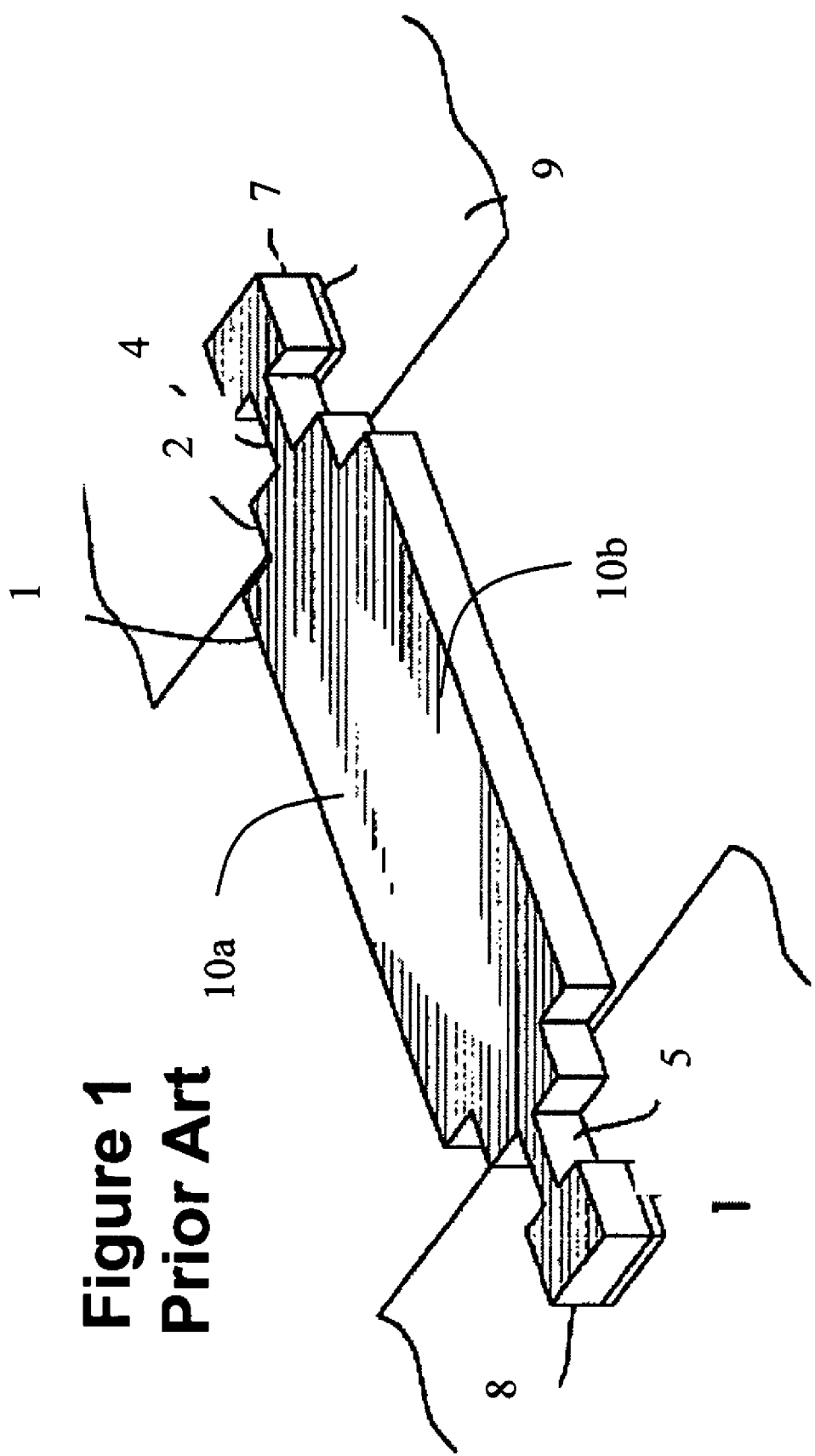
FIG. 1 is an isometric view of a conventional micro-mirror structure.
Figure 2B:
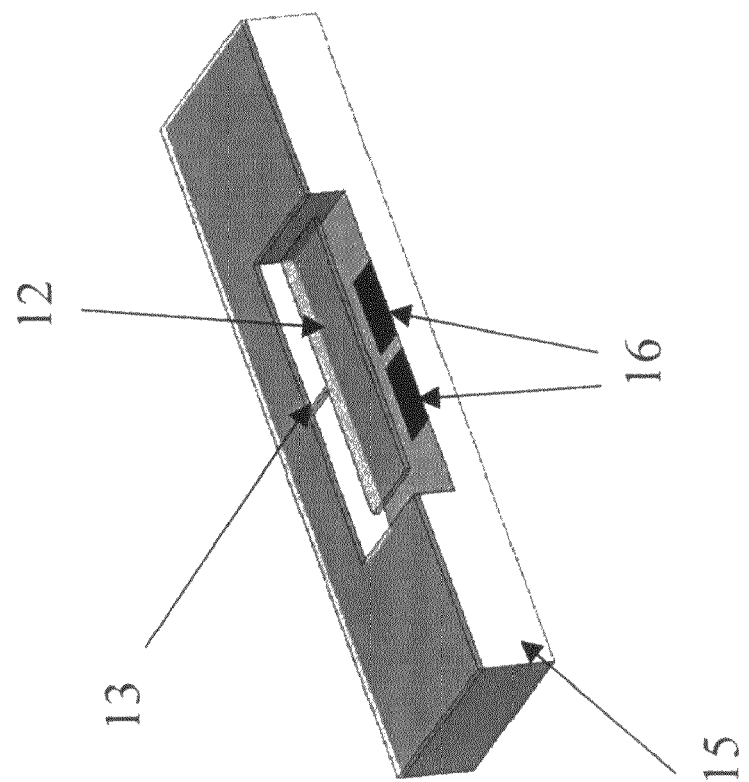
Figure 2A:
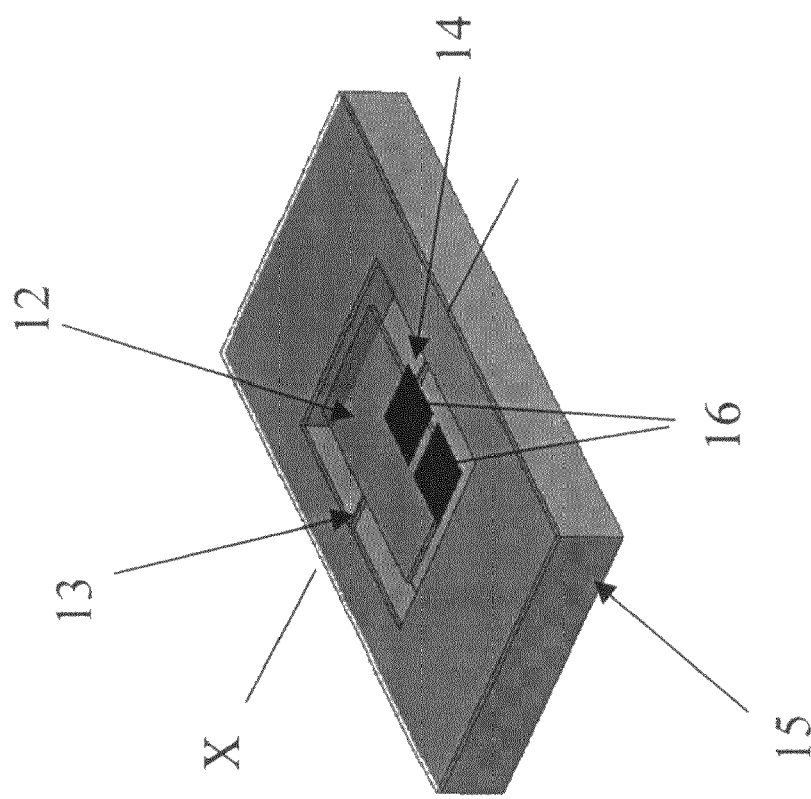
FIG. 2a is an isometric view of the large micro-mirror structure in accordance with the present invention.
Figure 3:
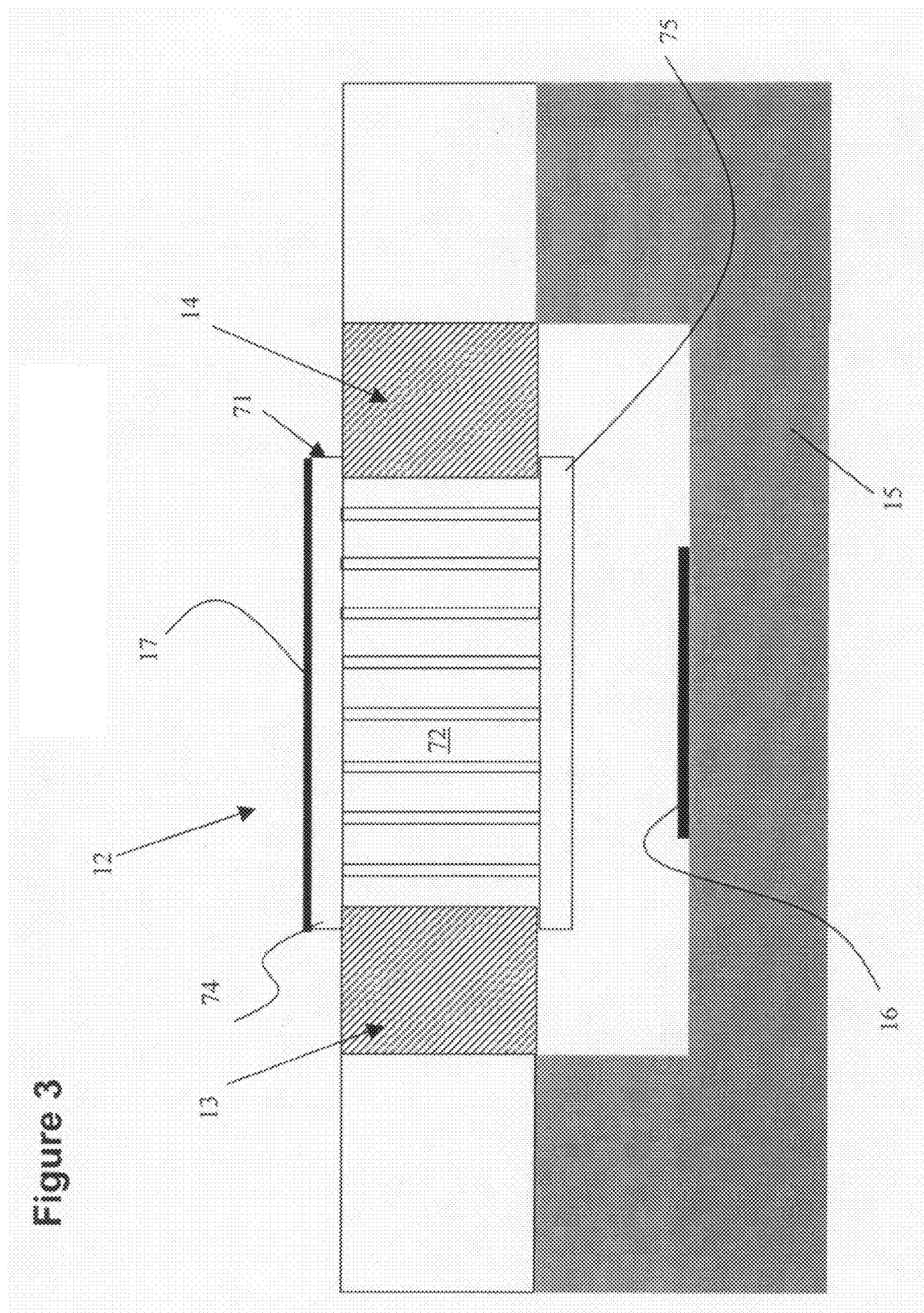
Figure 4:
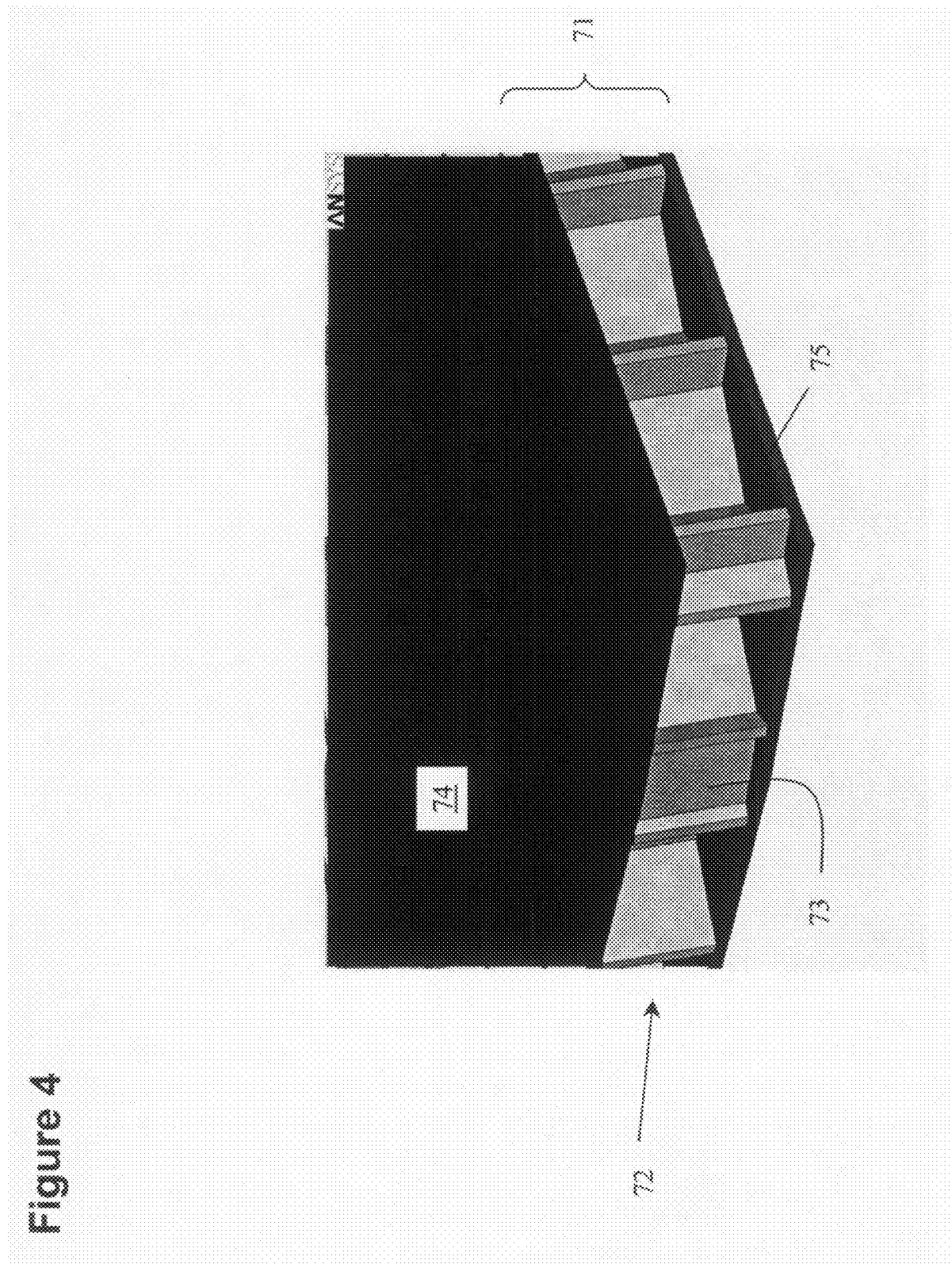
Figure 5:
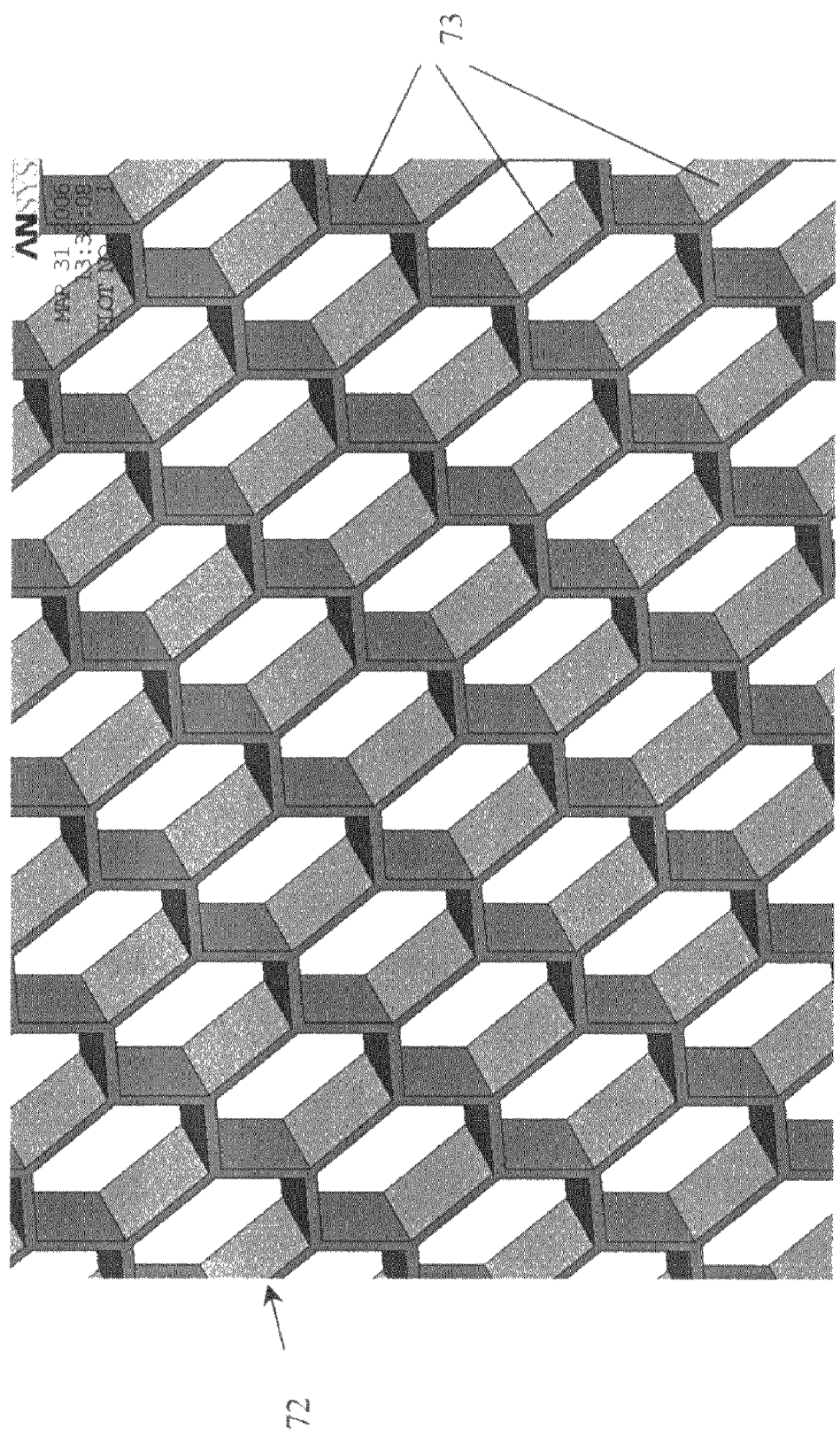

With reference to FIGS. 2a and 2b, a micro-electro-mechanical (MEMS) mirror device 11 with a relatively large mirrored platform 12, e.g. 3 mm×4 mm, includes symmetric torsional hinges 13 and 14 enabling the mirrored platform 12 to pivot about a horizontal axis X above a substrate 15. The hinges 13 and 14 may be serpentine hinges, as hereinbefore discussed. One or more electro-static electrodes 16, or some other means of attracting or repulsing one side of the mirrored platform 12 towards or away from the substrate 15, are provided beneath the mirrored platform 12 for controlling the angular position thereof. The mirrored platform 12 tilts towards the substrate 15 when a voltage is applied to one of the electrodes 16 with respect to the grounded mirrored platform 12 due to the electrostatic force of attraction. Spring forces in the hinges 13 and 14 can restore the mirrored platform 12 to a horizontal position. A second electrode 16 can be provided for mirror actuation in the opposing direction, if bi-direction actuation is desired. The mirrored platform 12 is coated with a reflective metallic layer 17, e.g. gold or aluminum, for redirecting beams of light incident thereon In accordance with the present invention, and with reference to FIGS. 3 to 5, the mirrored platforms 12 are comprised of a sandwich structure 71 including of a light core 72, with closed cells 73, which are preferably regular hexagonal as shown in FIGS. 5 and 6, and upper and lower stiff outer skins 74 and 75 symmetrically attached to both sides of the core 72. The curvature stability is provided by the two solid skins 74 and 75, separated by the relatively thick core 72, which gives rise to a large second moment of area and hence high bending resistance. Practically negligible curvature, e.g. approximately $0.2\ m^{-1}$ with a radius of curvature of approximately 5 m, can be achieved, while achieving a resonance frequency of 1000 Hz without making the mirror hinges 13 and 14 becoming too stiff to be actuated to the required angle at acceptable voltage levels, for a mirror size of 2 mm to 3 mm.

Preferably each closed cell is hexagonal in shape (see FIG. 5) with walls that are 4 to 6 um thick, 40 to 60 um long, and 40 um to 60 um high; however, other closed cellular shapes are also possible including square, rectangular, pentagonal etc. Ideally, each of the upper and lower outer skins 74 and 75 are 4 to 6 um thick, e.g. one tenth to one fifteenth the thickness of the core 72. To ensure the proper optical performance the upper skin 74 has an upper surface that is solid and smooth without any indentations or holes.

The first and second torsional hinges 13 and 14 may be made of any one or more of the upper and lower stiff outer skins 74 and 75 and the core layer 72, but preferably is contiguous with the core layer 72, as the other two layers 74 and 75 may be too thin and weak in bending. In a preferred embodiment, the bottom and top skins 74 and 75 are removed in the areas of the hinge 13 and 14. The hinges 13 and 14 may also be made contiguous with a combination of the upper and lower stiff outer skins 74 and 75 and the core layer 72.

The mirrored platform 12 is made relatively thick and light by having a cellular structure as a thick core 72. The cells 73 may be designed to have core density of <10% of the bulk density, thereby reducing the mass of the sandwich structure 71 drastically, and hence the mass moment of inertia for torsional micro-mirror applications may be reduced drastically, which enables relatively high resonance frequency for a given hinge spring constant. The thick core 72 provides a relatively large second moment of area, therefore a high bending resistance and greater control over stress-induced curvature. Furthermore, both the upper and lower outer skins 74 and 75 form solid, smooth, flat, contiguous, uniform, uninterrupted and undisturbed surfaces, free from holes, dimples or other irregularities.

A typical process is illustrated in FIGS. 6a to 6g, in which a first SOI structure 101 is provided, including an first silicon layer 102 providing a handle, a first oxide etch stop layer 103, e.g. silicon oxide, forming the lower skin 75, and an second silicon layer 104 forming the core 72. In the second step (FIG. 6b) the second silicon layer 104 is patterned and etched down to the first oxide layer 103 forming the core layer 72 with cells 73. The second silicon layer 104 also includes wing sections on either side thereof for forming the hinges 13 and 14, as well as a cap for mounting on the substrate 15. In the next step, illustrated in FIG. 6c, a second SOI structure 105, including a third silicon layer 106, e.g. a silicon wafer, with a second oxide layer 107, e.g. silicon oxide, thermally (or by some other method) grown thereon, is bonded, e.g. fusion bonded, to the second silicon layer 104 of the first SOI structure 101. In the next step (FIG. 6d) one of the handle layers, i.e. first silicon layer 102, is removed, e.g. etched away, along with portions of the first oxide stop layer 103, to define the mirrored platform structure 12 in which the first and second oxide layers 103 and 107 form the upper and lower skins 74 and 75, respectively. The purpose of the remaining handle layer 106 is to provide ruggedness for handling the wafer during further processing of the sandwich mirror, e.g. bonding to a substrate during device construction.

Figure 6A:
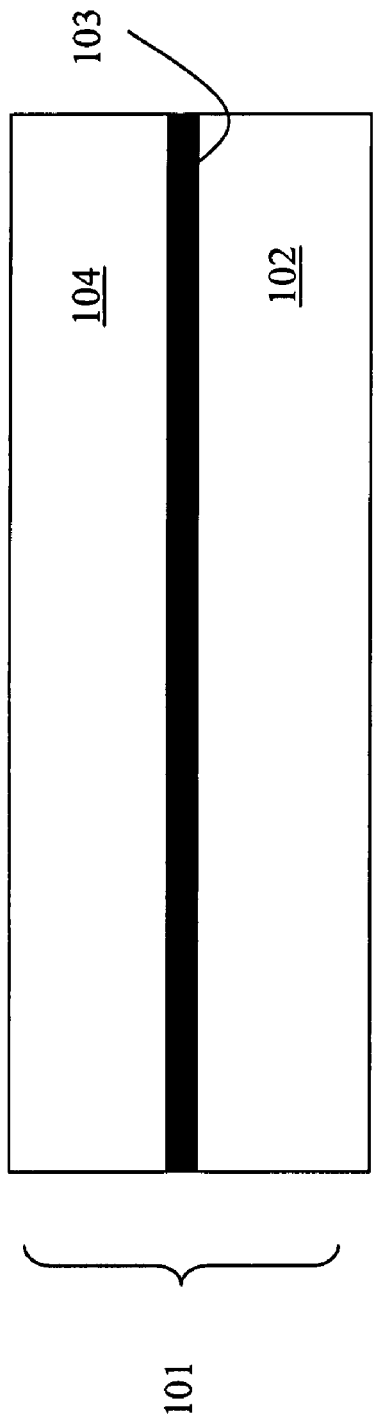
Figure 6B:
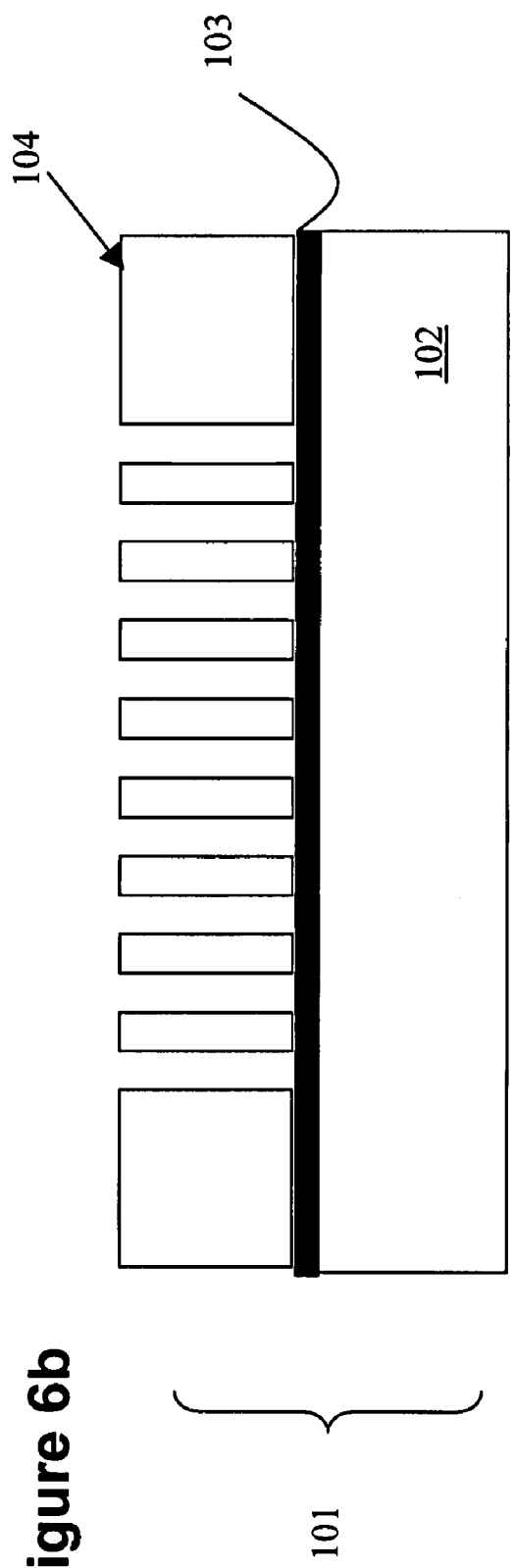
Figure 6E:
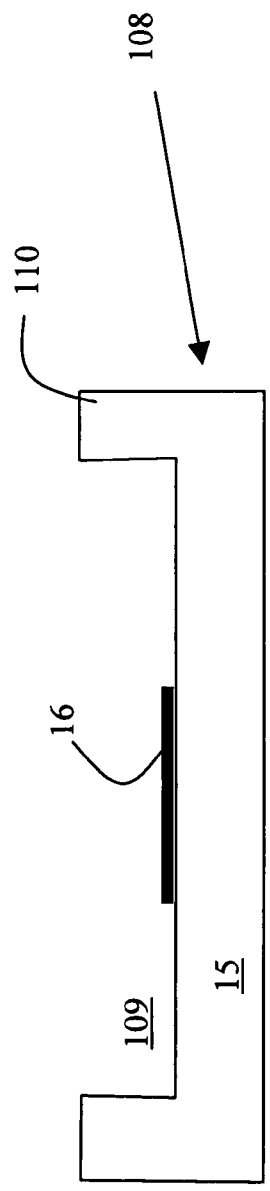
Figure 6F:
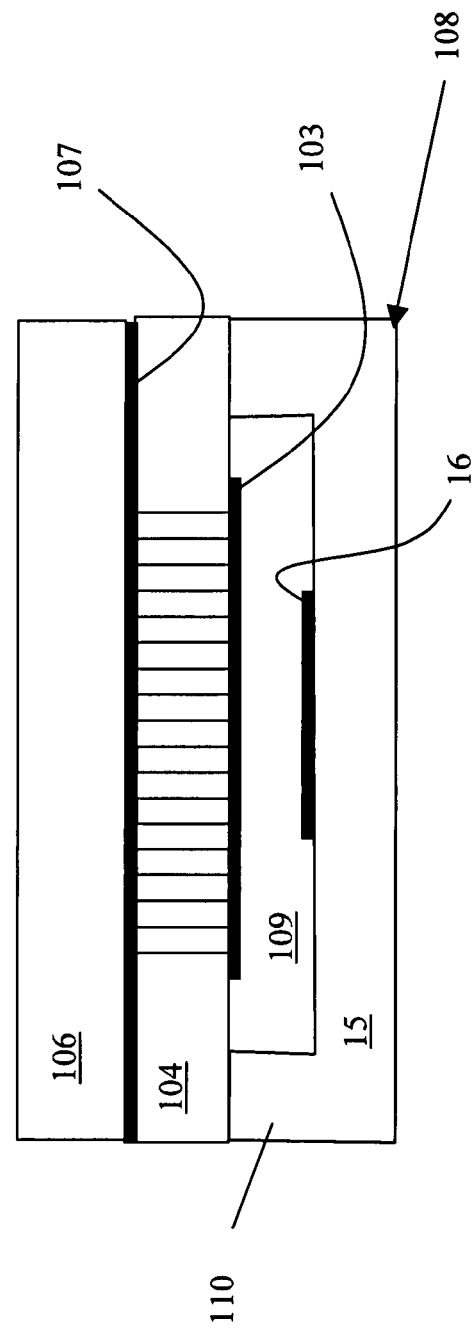
Figure 6G:
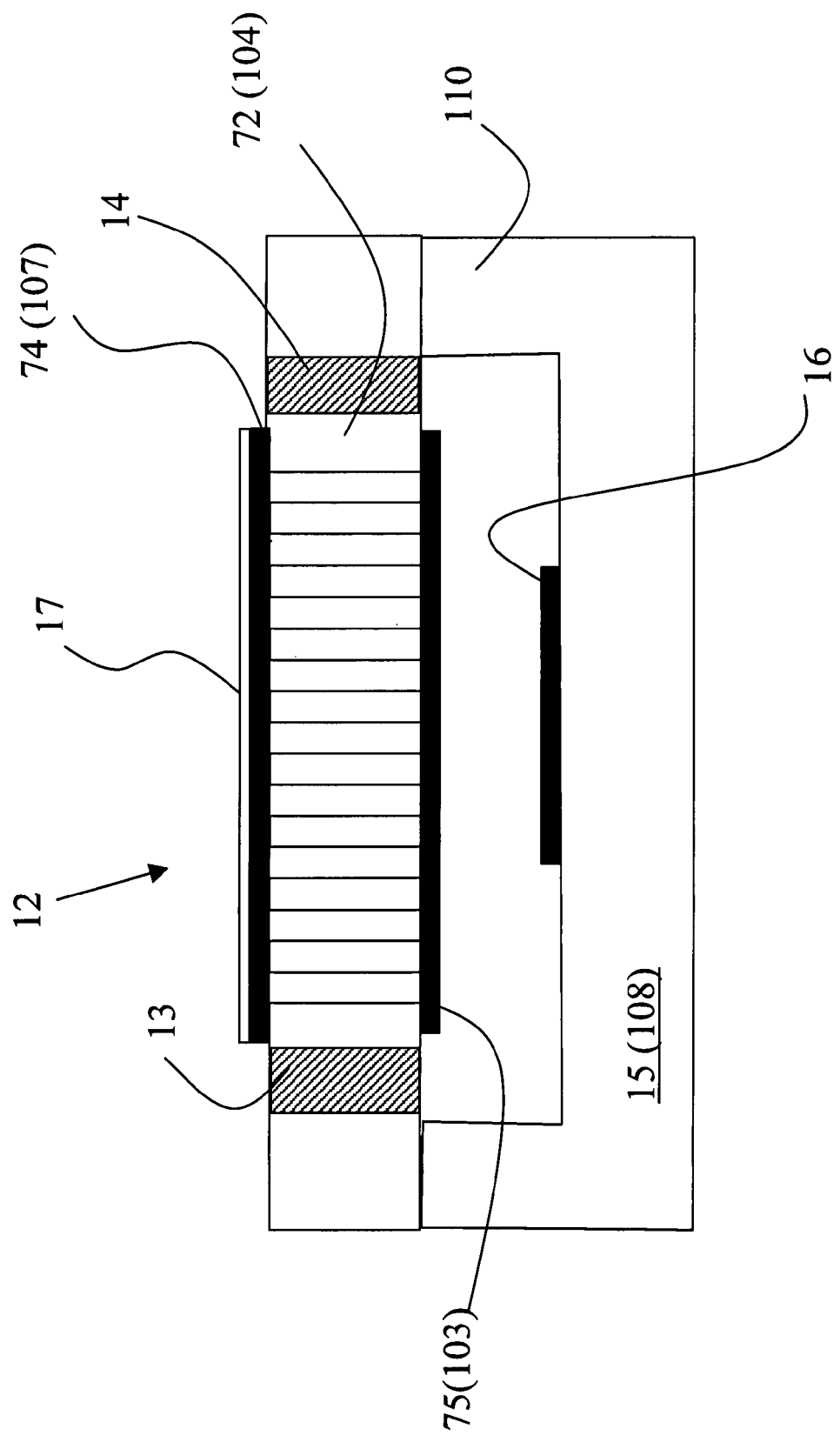

In finishing steps (FIGS. 6e to 6g) a wafer 108 is provided defining the substrate 15 with a recess 109 surrounded by supporting walls 110, providing the necessary clearance for the mirrored platform 12. The electrodes 16 are patterned on the lower surface of the recess 109. The substrate 15 may be comprised of glass (Pyrex®), silicon or other suitable material. For silicon substrates an oxide layer (not shown) may be used to electrically isolate the mirror layer 17 from the substrate 15. The cap sections surrounding the mirrored platforms 12 of the honeycomb sandwich, from FIG. 6d, is then bonded to the walls 110 of the substrate 15 (FIG. 6f). The final steps are illustrated in FIG. 6g, wherein: i) the honeycomb handle wafer, e.g. third silicon layer 106, is removed, ii) the reflective metal layer 17 is deposited on the top of the upper skin 74, e.g. the second oxide layer 107, and iii) deep reactive ion etching (DRIE) is performed to fabricate the hinges 13 and 14 and float the mirrored platform 12 above the substrate 15. Preferably, the first and second torsional hinges 13 and 14 are etched into only the second silicon layer 104, i.e. the core layer 72, (as in FIG. 3); however, the first and second hinges can be formed from the second silicon layer 104, i.e. the core layer 72, and the first or second oxide layers 103 and 107, i.e. the lower and upper skin layers 75 and 74, respectively, or into all three of the second silicon layer 104, i.e. the core layer 72, and the first and second oxide layers 103 and 107, i.e. the upper and lower skin layers 74 and 75.

FIGS. 7a to 7g illustrate another process in which a first SOI structure 111 is provided, including an first silicon layer 112 providing a handle, a first oxide etch stop layer 113, and a second silicon layer 114 forming the core 72 and the lower skin 74. In the second step, illustrated in FIG. 7b, the second silicon layer 114 is etched down to form the core layer 72 with cells 73, while leaving a thin layer, e.g. 3 to 6 um, of the second silicon layer 114 for the lower skin 75. The second silicon layer 114 also includes wing sections on either side thereof for forming the hinges 13 and 14, as well as a cap for mounting on the substrate 15. A second SOI structure 115 is provided in the next step (FIG. 7c) including a thin, e.g. 3 um to 6 um, third silicon layer 116 forming the upper skin 74, a second etch stop oxide layer 117, and a fourth silicon layer 118 providing a handle. The second SOI structure 115 is bonded, e.g. fusion bonded, onto the second silicon layer 114 of the first SOI structure 111, whereby the third silicon layer 116 is adjacent to the second silicon layer 114. In the final step (FIG. 7d) one of the handle layers, i.e. the first silicon layer 112, with the corresponding oxide layer, e.g. the first oxide layers 113, is removed, e.g. etched away, to define the mirrored platform structure 12 in which the third silicon layer 116 and the thin layer of the second silicon layer 114 form the upper and lower skins 74 and 75, respectively.

Figure 7A:
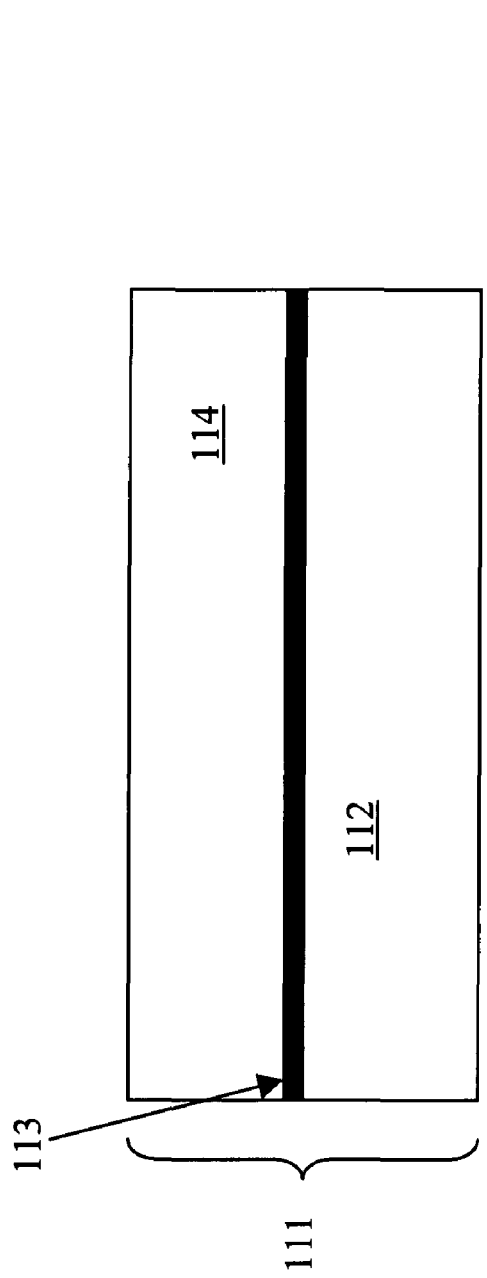
Figure 7B:
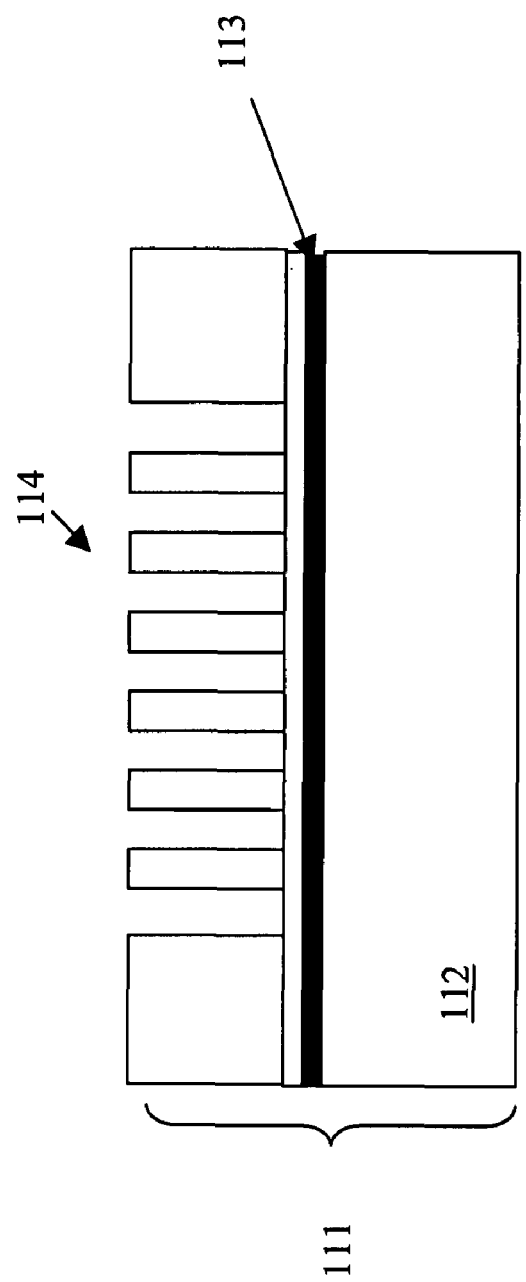
Figure 7C:
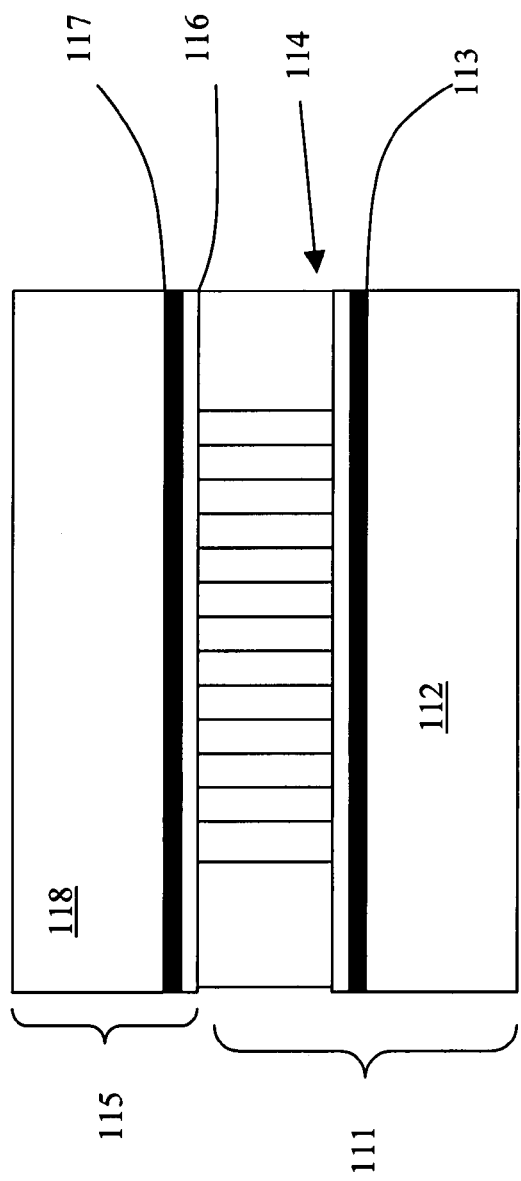
Figure 7D:
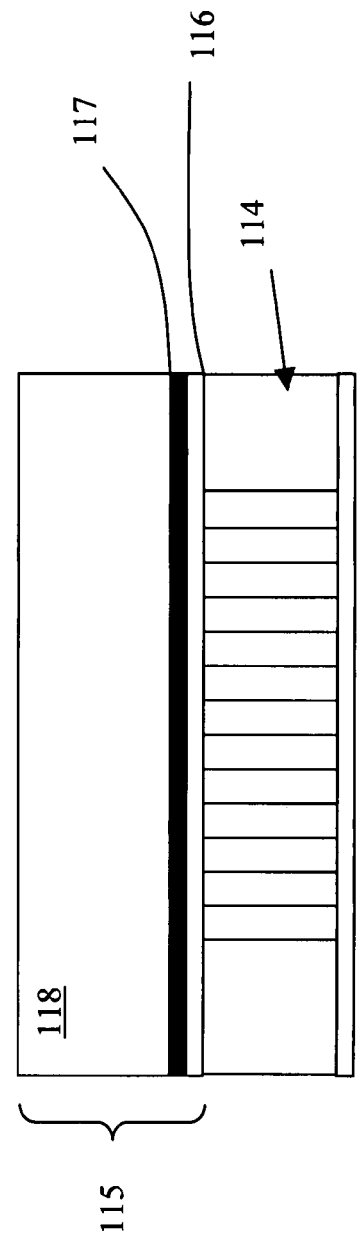
Figure 7E:
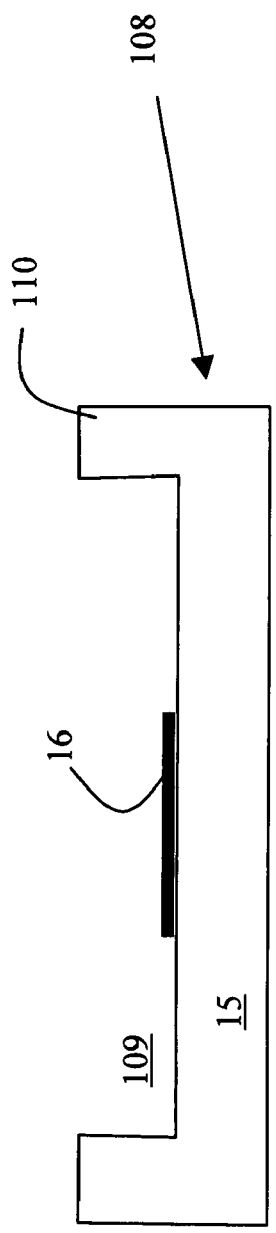
Figure 7F:
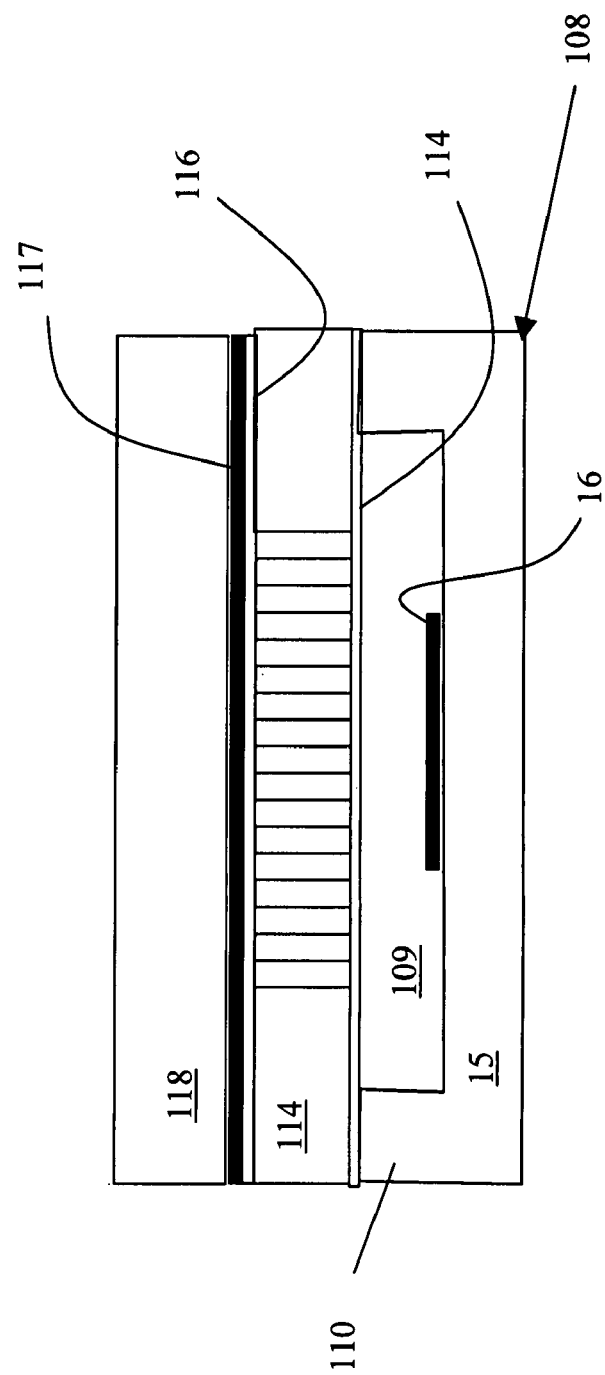
Figure 7G:
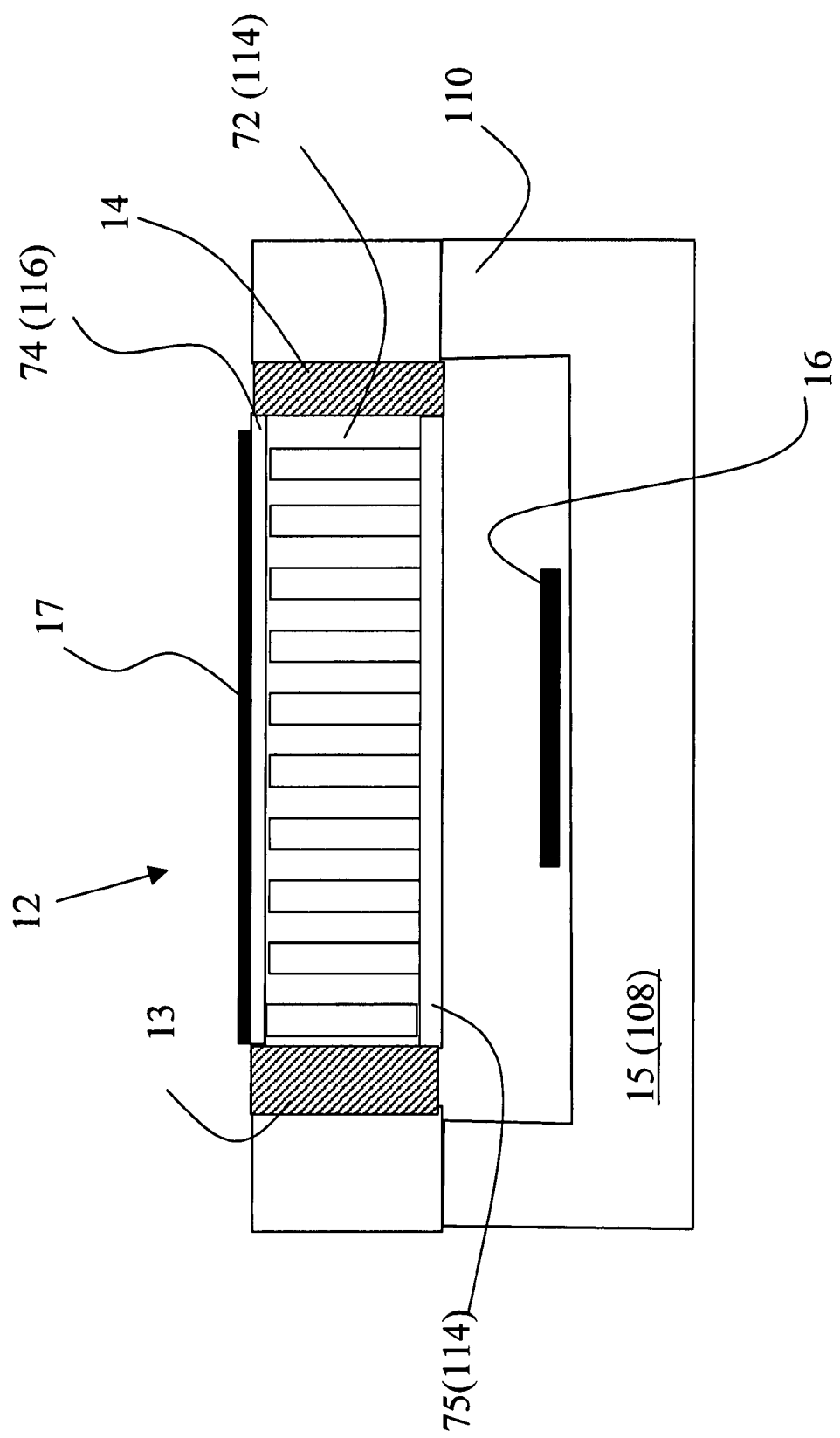

As above, in the finishing steps (FIGS. 7e to 7g) a wafer 108 is provided defining the substrate 15 with a recess 109 surrounded by supporting walls 110, providing the necessary clearance for the mirrored platform 12. The electrodes 16 are patterned on the lower surface of the recess 109. The substrate 15 may be comprised of glass (Pyrex®), silicon or other suitable material. The cap sections surrounding the mirrored platforms 12 of the honeycomb sandwich, from FIG. 7d, is then bonded to the walls 110 of the substrate 15 (FIG. 7f). The final steps are illustrated in FIG. 7g, wherein: i) the honeycomb handle wafer, e.g. fourth silicon layer 118 and the second oxide layer 117, is removed, ii) the reflective metal layer 17 is deposited on the top of the upper skin 74, e.g. the third silicon layer 116, and iii) deep reactive ion etching (DRIE) is performed to fabricate the hinges 13 and 14 and float the mirrored platform 12 above the substrate 15. Preferably, the first and second torsional hinges 13 and 14 are etched into only the second silicon layer 114, i.e. the core layer 72, (as in FIG. 3); however, the first and second hinges can be formed from the second silicon layer 114, i.e. the core layer 72, and the second or third silicon layers 114 or 116, i.e. the upper or lower skin layers 74 and 75, or into all three of the second silicon layer 114, i.e. the core layer 72, the thin portion of the second silicon layer 114, i.e. the lower skin layer 75, and the third silicon layer 116, i.e. the upper skin layer 74, as in FIG. 7g.

FIGS. 8a to 8d illustrate another process in which a first double SOI structure 121 is provided, including an first silicon layer 122, in between first and second oxide etch stop layers 123 and 124, a second silicon layer 125 forming the core 72, and a bottom silicon layer 126 forming a handle. The first silicon layer 122 and the first oxide layer 123 combine to form the lower skin 75. In the second step, illustrated in FIG. 8b, the second silicon layer 125 is etched down to the first oxide stop layer 123 to form the core layer 72 with cells 73. The second silicon layer 125 also includes wing sections on either side thereof for forming the hinges 13 and 14, as well as a cap for mounting on the substrate 15. A second SOI structure 127 is provided in the next step (FIG. 8c) including an third thin silicon layer 128, e.g. 2 um to 6 um, a third etch stop oxide layer 129, a fourth silicon layer 130, and a fourth etch stop oxide layer 131. The third silicon layer 128, along with the third oxide layer 129 forms the upper skin 74. The second SOI structure 127 is bonded, e.g. fusion bonded, onto the first SOI structure 121, whereby the third oxide layer 129 is adjacent to the second silicon layer 125. In the final step (FIG. 8d) one of the handle layers, e.g. the bottom silicon layer 126, with the corresponding oxide layer, e.g. the second oxide layer 124, is removed, e.g. etched away, along with the portions of the first silicon layers 122 and the first oxide layer 123 surrounding the mirrored platform 12, to define the mirrored platform structure 12 in which the first silicon layer 122 and the first oxide layer 123 combine to form the lower skin 75, and the third etch stop oxide layer 129 along with the third silicon layer 128 forms the upper skin 74.

Figure 8A:
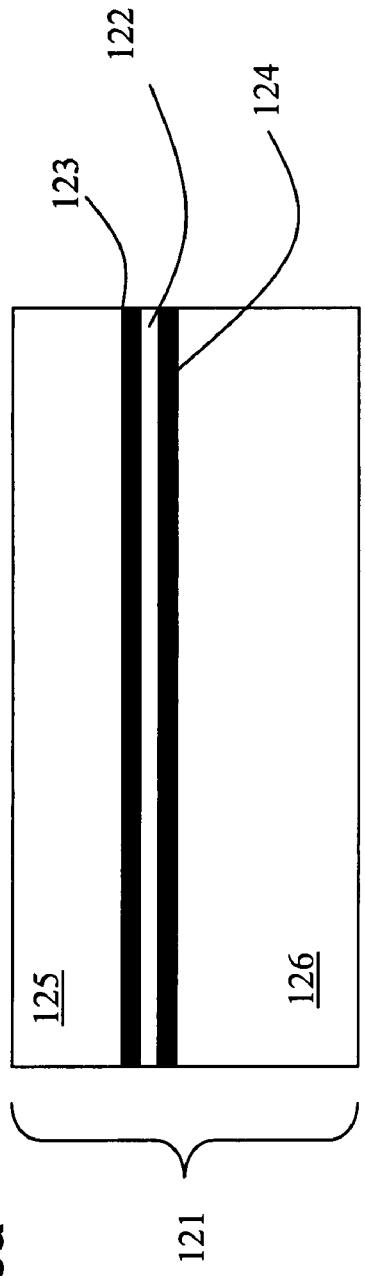
Figure 8B:
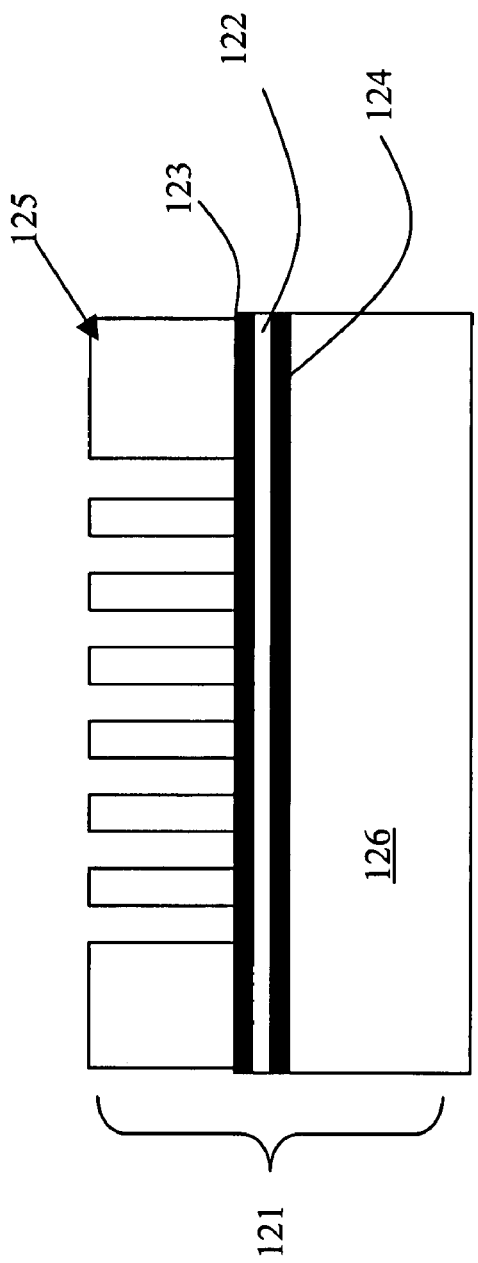
Figure 8E:
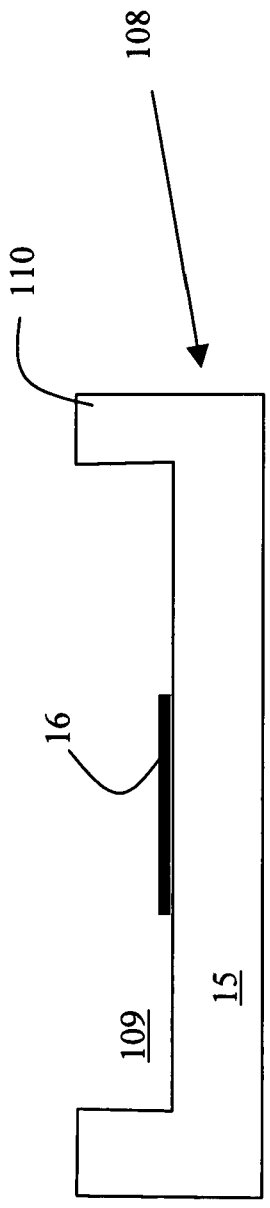
Figure 8F:
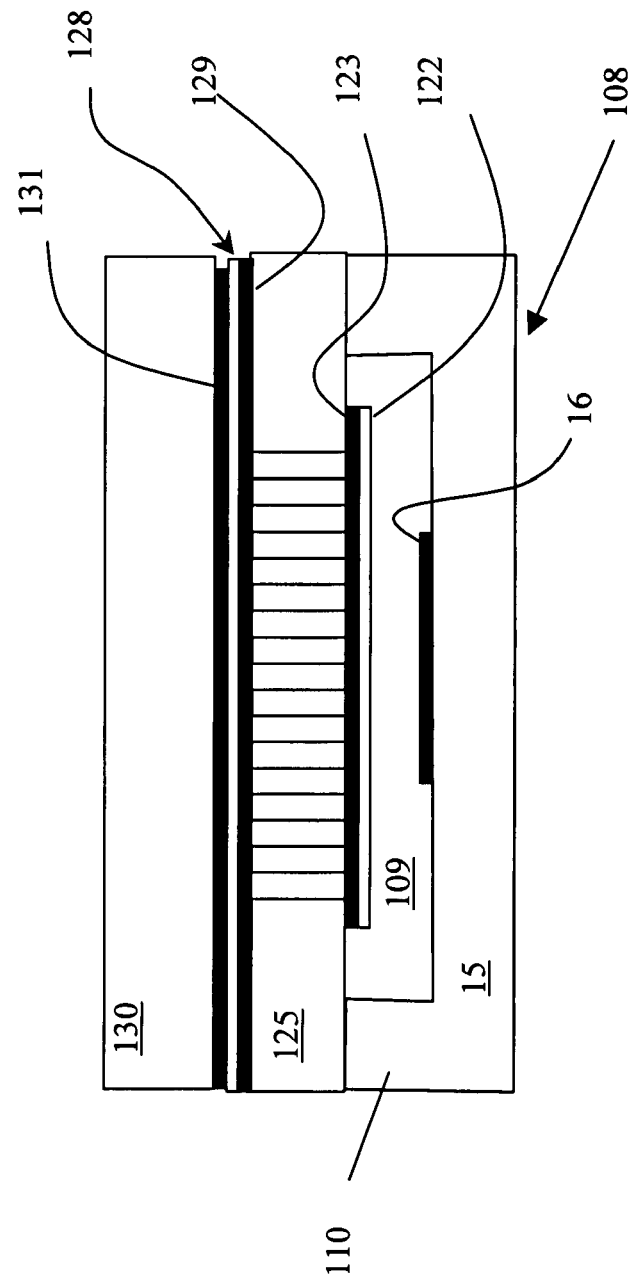
Figure 8G:
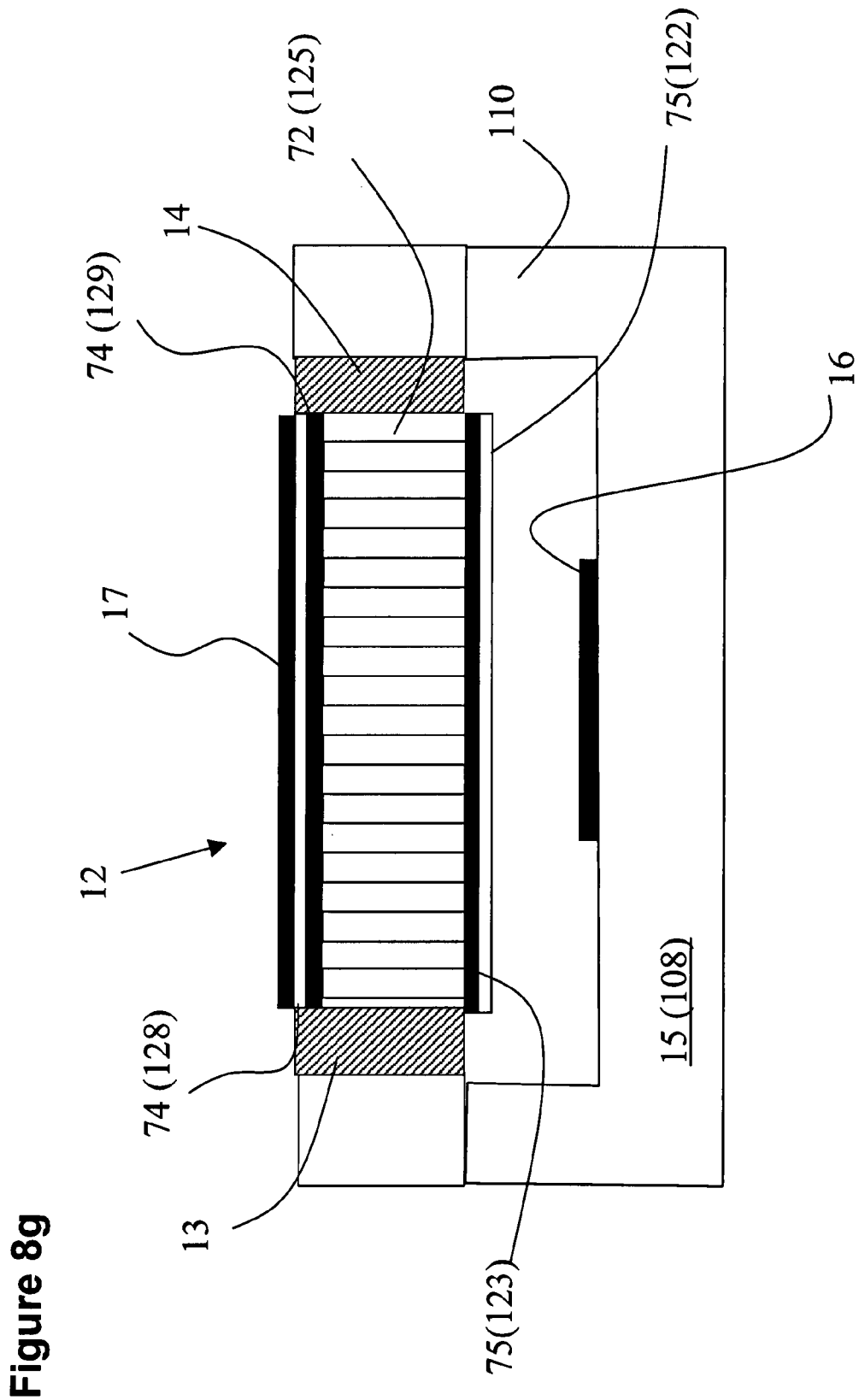

As above, in finishing steps (FIGS. 8e to 8g) a wafer 108 is provided defining the substrate 15 with a recess 109 surrounded by supporting walls 110, providing the necessary clearance for the mirrored platform 12. The electrodes 16 are patterned on the lower surface of the recess 109. The substrate 15 may be comprised of glass (Pyrex®), silicon or other suitable material. The cap sections surrounding the mirrored platforms 12 of the honeycomb sandwich, from FIG. 8d, is then bonded to the walls 110 of the substrate 15 (FIG. 8f). The final steps are illustrated in FIG. 8g, wherein: i) the honeycomb handle wafer, e.g. fourth silicon layer 130 and fourth oxide layer 131, is removed, ii) the reflective metal layer 17 is deposited on the top of the upper skin 74, e.g. the third silicon layer 128, and iii) deep reactive ion etching (DRIE) is performed to fabricate the hinges 13 and 14 and float the mirrored platform 12 above the substrate 15. Preferably, the first and second torsional hinges 13 and 14 are etched into only the second silicon layer 125, i.e. the core layer 72, (as in FIG. 3); however, the first and second hinges can be formed from the second silicon layer 125, i.e. the core layer 72, and the first or third silicon layers 122 or 128, i.e. the upper or lower skin layers 74 and 75, (as in FIG. 8g) or into all three of the second silicon layer 125, i.e. the core layer 72, and the first and third silicon layers 122 and 128, i.e. the lower and upper skin layers 74 and 75, (as in FIG. 7g).

The aforementioned processes are preferably executed using SOI structures; however, other semiconductor structures can be used with suitable insulator, e.g. silicon on fused silica or quartz, silicon on glass such as Pyrex, silicon carbide on oxidized silicon, and indium phosphide (inP) or gallium arsenide (GaAs) on oxidized silicon.

I claim:

1. A micro-mirror device comprising:
   a substrate;
   a mirrored platform including an upper uniform, smooth and uninterrupted layer free from holes; a core layer having a closed cellular structure; and a lower uniform, smooth and uninterrupted layer free from holes, wherein the upper and lower layers are attached on opposite sides of the core layer forming a sandwich structure, with the core layer between the upper and lower layers, thereby closing the closed cellular structure in all three dimensions;
   a hinge structure enabling the mirrored platform to rotate about an axis of rotation above the substrate; and
   an electrode supported by the substrate for rotating the mirrored platform about the axis of rotation.

2. The device according to claim 1, wherein the core and lower layers are contiguous, and the upper layer is bonded thereto.

3. The device according to claim 1, wherein the core layer comprises a semiconductor material, and the upper and lower layers comprise an insulator material.

4. The device according to claim 3, wherein each hexagonal cell in the core layer has walls that are 4 µm to 6 µm thick, and 40 µm to 60 µm long.

5. The device according to claim 1, wherein the upper layer comprises a layer of semiconductor material and a layer of insulator material.

6. The device according to claim 1, wherein the core layer has a core density of <10% of a bulk density thereof.

7. The device according to claim 1, wherein the core layer is comprised of a plurality of closed hexagonal cells.

8. The device according to claim 1, wherein the core layer is 40 μm to 60 μm high; and wherein the upper layer is 4 μm to 6 μm thick.

9. The device according to claim 1, wherein the hinge extends from the mirrored platform, and is contiguous with only the core layer.

10. The device according to claim 1, wherein the hinge extends from the mirrored platform, and is contiguous with the upper layer, core layer and the lower layer.

11. The device according to claim 1, wherein the hinge extends from the mirrored platform, and is contiguous with the core layer and only one of the lower layer and the upper layer.

12. The device according to claim 1, further comprising a reflective metal layer on the upper layer.

* * * * *